United States Patent
Teunissen et al.

(10) Patent No.: US 7,582,881 B2
(45) Date of Patent: Sep. 1, 2009

(54) LITHOGRAPHIC APPARATUS AND DEVICE MANUFACTURING METHOD

(75) Inventors: Franciscus Johannes Herman Maria Teunissen, Rotterdam (NL); Raymond Charles Carnahan, Pleasanton, CA (US)

(73) Assignee: ASML Netherlands B.V., Veldhoven (NL)

( * ) Notice: Subject to any disclaimer, the term of this patent is extended or adjusted under 35 U.S.C. 154(b) by 40 days.

(21) Appl. No.: 11/902,857

(22) Filed: Sep. 26, 2007

(65) Prior Publication Data

US 2008/0023652 A1    Jan. 31, 2008

Related U.S. Application Data

(63) Continuation of application No. 11/101,653, filed on Apr. 8, 2005, now Pat. No. 7,291,850.

(51) Int. Cl.
  *G01N 21/00* (2006.01)
(52) U.S. Cl. .......................... 250/454.11; 250/453.11; 250/492.2
(58) Field of Classification Search .............................. 250/453.11–455.11, 526, 428–432 PD, 491.1, 250/492.1–492.3, 493.1–504 H
  See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—David A Vanore
*Assistant Examiner*—Andrew Smyth
(74) *Attorney, Agent, or Firm*—Pillsbury Winthrop Shaw Pittman LLP

(57) ABSTRACT

A method and apparatus for monitoring a level of silicon dioxide in a liquid and removing the silicon dioxide using polishers is disclosed. In an embodiment, two polishers that absorb carbon dioxide and silicon dioxide, but which have a greater affinity for carbon dioxide, are placed in series along a conduit containing the liquid for use in an immersion lithographic apparatus. The upstream polisher absorbs carbon dioxide and silicon dioxide until it is saturated, at which point it desorbs the silicon dioxide in preference for the carbon dioxide. Silicon dioxide continues down the conduit and is absorbed by the downstream polisher. Once the upstream polisher is saturated with carbon dioxide, carbon dioxide present in the liquid flows downstream where it is absorbed by the downstream polisher. A sensor between the polishers senses the presence of carbon dioxide and initiates a request for the one or more of polishers to be cleaned or replaced.

25 Claims, 4 Drawing Sheets

U.S. PATENT DOCUMENTS

| | | | | |
|---|---|---|---|---|
| 5,121,256 | A | 6/1992 | Corle et al. | 359/664 |
| 5,610,683 | A | 3/1997 | Takahashi | 355/53 |
| 5,825,043 | A | 10/1998 | Suwa | 250/548 |
| 5,900,354 | A | 5/1999 | Batchelder | 430/395 |
| 5,959,297 | A * | 9/1999 | Weinberg et al. | 506/12 |
| 6,191,429 | B1 | 2/2001 | Suwa | 250/548 |
| 6,236,634 | B1 | 5/2001 | Lee et al. | 369/112 |
| 6,600,547 | B2 | 7/2003 | Watson et al. | 355/30 |
| 6,603,130 | B1 | 8/2003 | Bisschops et al. | 250/492.1 |
| 7,029,832 | B2 * | 4/2006 | Rolland et al. | 430/322 |
| 7,156,925 | B1 * | 1/2007 | Subramanian et al. | 134/1 |
| 7,291,850 | B2 * | 11/2007 | Teunissen et al. | 250/492.2 |
| 7,317,504 | B2 * | 1/2008 | De Smit et al. | 355/30 |
| 7,428,038 | B2 * | 9/2008 | Verhagen et al. | 355/53 |
| 2002/0020821 | A1 | 2/2002 | Van Santen et al. | 250/492 |
| 2002/0163629 | A1 | 11/2002 | Switkes et al. | 355/53 |
| 2003/0123040 | A1 | 7/2003 | Almogy | 355/69 |
| 2004/0000627 | A1 | 1/2004 | Schuster | 250/201.2 |
| 2004/0075895 | A1 | 4/2004 | Lin | 359/380 |
| 2004/0114117 | A1 | 6/2004 | Bleeker | 355/53 |
| 2004/0136494 | A1 | 7/2004 | Lof et al. | 378/34 |
| 2004/0160582 | A1 | 8/2004 | Lof et al. | 355/30 |
| 2004/0165159 | A1 | 8/2004 | Lof et al. | 355/30 |
| 2004/0180299 | A1 * | 9/2004 | Rolland et al. | 430/322 |
| 2004/0207824 | A1 | 10/2004 | Lof et al. | 355/30 |
| 2004/0211920 | A1 | 10/2004 | Derksen et al. | 250/492.1 |
| 2004/0239954 | A1 | 12/2004 | Bischoff | 356/635 |
| 2004/0263809 | A1 | 12/2004 | Nakano | 355/30 |
| 2005/0007569 | A1 | 1/2005 | Streefkerk et al. | 355/30 |
| 2005/0018155 | A1 | 1/2005 | Cox et al. | 355/30 |
| 2005/0024609 | A1 * | 2/2005 | De Smit et al. | 355/18 |
| 2005/0030497 | A1 | 2/2005 | Nakamura | 355/30 |
| 2005/0046813 | A1 | 3/2005 | Streefkerk et al. | 355/30 |
| 2005/0046934 | A1 | 3/2005 | Ho et al. | 359/380 |
| 2005/0052632 | A1 | 3/2005 | Miyajima | 355/53 |
| 2005/0078286 | A1 * | 4/2005 | Dierichs et al. | 355/30 |
| 2005/0094116 | A1 | 5/2005 | Flagello et al. | 355/53 |
| 2005/0094125 | A1 | 5/2005 | Arai | 355/72 |
| 2005/0122505 | A1 | 6/2005 | Miyajima | 355/72 |
| 2005/0132914 | A1 | 6/2005 | Mulkens et al. | 101/463.1 |
| 2005/0134817 | A1 | 6/2005 | Nakamura | 355/53 |
| 2005/0140948 | A1 | 6/2005 | Tokita | 355/30 |
| 2005/0146693 | A1 | 7/2005 | Ohsaki | 355/30 |
| 2005/0146694 | A1 | 7/2005 | Tokita | 355/30 |
| 2005/0151942 | A1 | 7/2005 | Kawashima | 355/30 |
| 2005/0170277 | A1 * | 8/2005 | Zannoni et al. | 430/270.1 |
| 2005/0200815 | A1 | 9/2005 | Akamatsu | 353/53 |
| 2005/0213065 | A1 | 9/2005 | Kitaoka | 355/53 |
| 2005/0213066 | A1 | 9/2005 | Sumiyoshi | 355/53 |
| 2005/0219489 | A1 | 10/2005 | Nei et al. | 355/53 |
| 2005/0233081 | A1 | 10/2005 | Tokita | 427/256 |
| 2006/0132731 | A1 * | 6/2006 | Jansen et al. | 355/30 |
| 2006/0192929 | A1 * | 8/2006 | Verhagen et al. | 355/53 |
| 2008/0023652 | A1 * | 1/2008 | Teunissen et al. | 250/492.2 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "⅛μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

\* cited by examiner

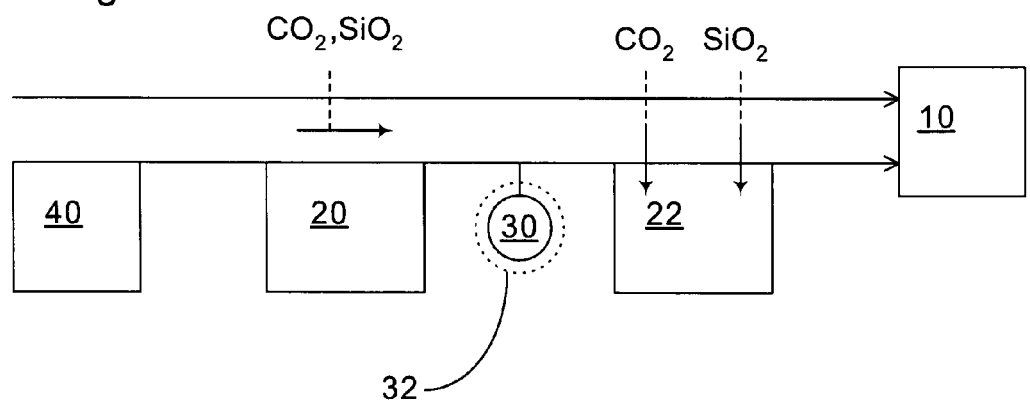

LITHOGRAPHIC APPARATUS AND DEVICE MANUFACTURING METHOD

RELATED APPLICATION

This application is a continuation of U.S. patent application Ser. No. 11/101,653 filed Apr. 8, 2005 now U.S. Pat. No. 7,921,850, the entire contents of which is hereby incorporated by reference.

FIELD

The present invention relates to a lithographic apparatus and a method for manufacturing a device. In particular, the present invention relates to an immersion system, in which a liquid is confined between a projection system and a substrate to be exposed by the projection system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

SUMMARY

As shown in FIGS. 2, 3, 4 and 5 (described in more detail below), while the substrate is being exposed, it comes into contact with the liquid held in the liquid confinement system. When the substrate is removed and is dried, particles in the liquid may be deposited on the surface of the substrate. These particles could cause defects in the pattern printed on the circuit, potentially rendering it unusable, particularly since methods used to remove the particles may remove layers of the pattern on the surface of the substrate also.

In order to purify the liquid to ensure that there are no bacteria, etc. in it, the liquid is treated with UV radiation and also undergoes "Total Organic Content" (TOC) removal. However, these do not remove or even sense the presence of silicon dioxide particles and furthermore, the UV radiation might be responsible for the presence of silicon dioxide by causing silicon to be converted into silicon dioxide, the silicon being present in the liquid because it erodes off the silicon-based substrate. The liquid therefore should be monitored for its silicon dioxide (silica) content. However, monitoring silica levels by taking samples of the liquid at regular intervals and analyzing these separately is labor-intensive and unreliable and requires logistical organization of people and laboratories. Furthermore, there is a delay between the sample being taken and the result of the analysis found, during which silica in the liquid may have already had a detrimental effect on a substrate.

One potential solution is to use in-line silica sensors, but these are expensive and complex and not sensitive enough to detect the small amounts of silica that could be detrimental to a substrate pattern. The required sensitivity of a silica sensor would be approximately 10 ppt.

Clearly, the silica should be removed. This may be done with liquid polishers in the liquid flow path. In an embodiment, the liquid polishers may be water polishers. Water polishers use ion exchangers to remove contaminants such as silica, etc. from ultra pure water (UPW). The polishers have a layer of ion-exchanging resin, which absorbs silica. This is a natural property of the resins that are commonly used in water polishers and is a consequence of the chemical reactions involved in the resins.

A problem with the polishers is that when the resin becomes saturated, it stops absorbing the problematic silica. This often happens suddenly so that there is no warning of the sudden presence of potentially high levels of silica in the liquid. There may then be no assurance of measuring the liquid at the right time to test for silica levels before silica particles are potentially deposited on the substrate.

Accordingly, it would be desirable, for example, to prevent or reduce the deposition of silicon dioxide particles on a substrate surface by detecting and removing silicon dioxide from the liquid in the immersion system.

According to an aspect of the present invention, there is provided an apparatus for removing silicon dioxide from liquid (and indirectly monitoring the level of silicon dioxide in the liquid), comprising a conduit configured to carry the liquid; a first polisher; a sensor; and a second polisher. The first polisher and the second polisher are arranged in series along the conduit so that the first polisher is upstream of the sensor, which in turn is upstream of the second polisher. The first and second polishers are configured to absorb carbon dioxide and silicon dioxide and have a greater affinity for carbon dioxide than for silicon dioxide. The sensor is configured to sense the presence of carbon dioxide in the liquid at a point between the two polishers.

According to another aspect of the present invention, there is provided a lithographic apparatus comprising a projection system; a substrate table configured to hold a substrate to be exposed by a radiation beam from the projection system; a liquid supply system configured to supply liquid to a liquid confinement system that is configured to confine liquid between the projection system and the substrate; and an apparatus configured to remove silicon dioxide from the liquid (and indirectly monitoring the presence of silicon dioxide in the liquid) as described above.

According to another aspect of the present invention, there is provided a method of removing silicon dioxide from liquid, by sensing the presence of carbon dioxide in a conduit between an upstream and a downstream polisher, the polishers absorbing silicon dioxide and carbon dioxide from the liquid in the conduit.

According to yet another aspect of the present invention, there is provided a method of removing silicon dioxide from the liquid, comprising providing a conduit for carrying the liquid; providing a first and second polisher along the conduit, the second polisher being downstream from the first polisher; providing a sensor for sensing carbon dioxide between the first and second polishers on the conduit; providing the liquid in the conduit; the first polisher absorbing silicon dioxide and carbon dioxide until it is saturated; the first polisher absorbing carbon dioxide and desorbing the absorbed silicon dioxide; the second polisher absorbing the silicon dioxide desorbed by the first polisher; the first polisher becoming saturated with carbon dioxide and ceasing to absorb carbon dioxide; the sensor sensing carbon dioxide in the liquid and transmitting a signal indicating that the polishers are saturated; and initiating a request that the polishers are replaced or cleaned; and the second polisher absorbing silicon dioxide and carbon dioxide until it is saturated, replaced or cleaned.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6a, 6b and 6c show the various steps according to an embodiment of a method of the invention.

DETAILED DESCRIPTION

Figure 1:
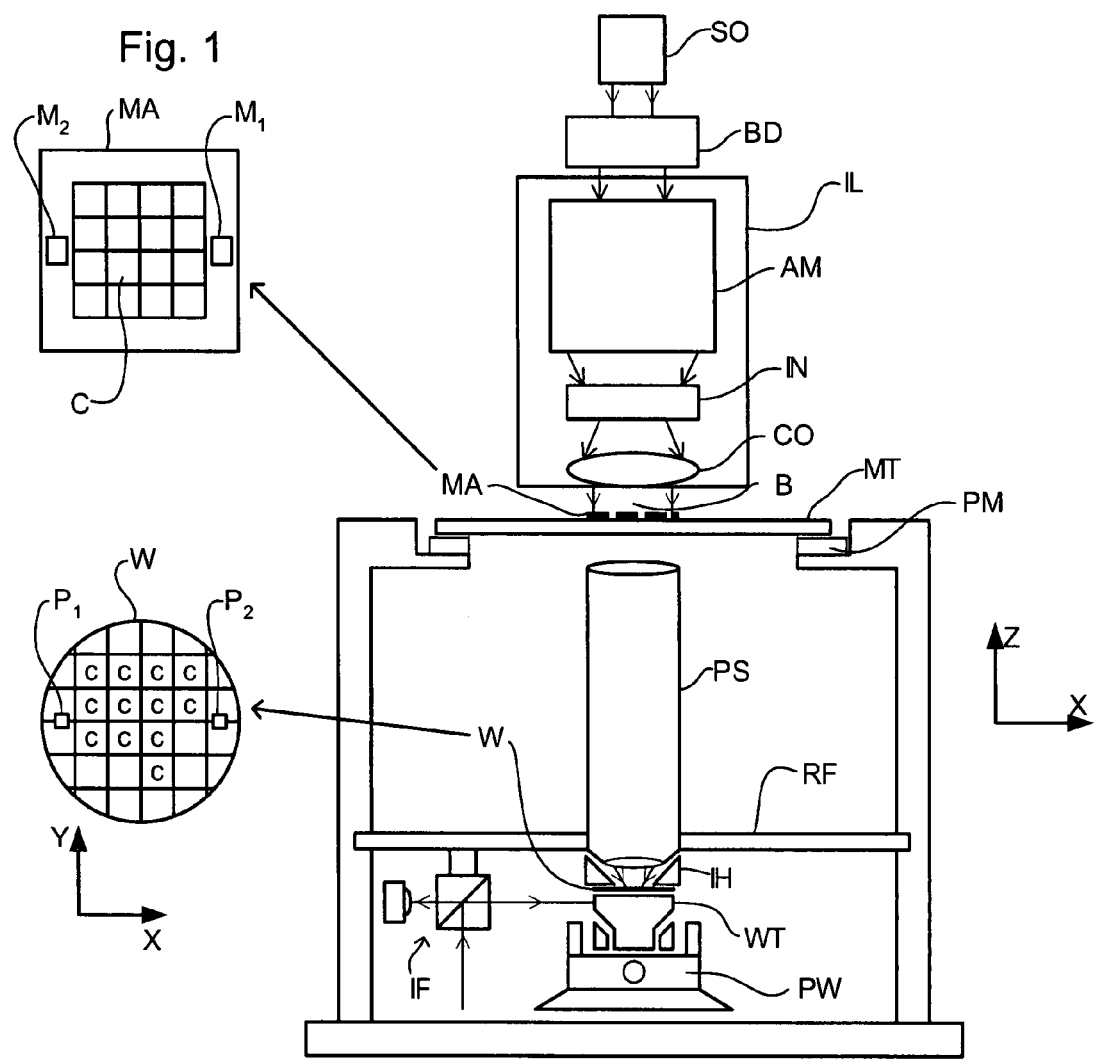
FIG. 1 depicts a lithographic apparatus according to an embodiment of the invention.
Figure 2:
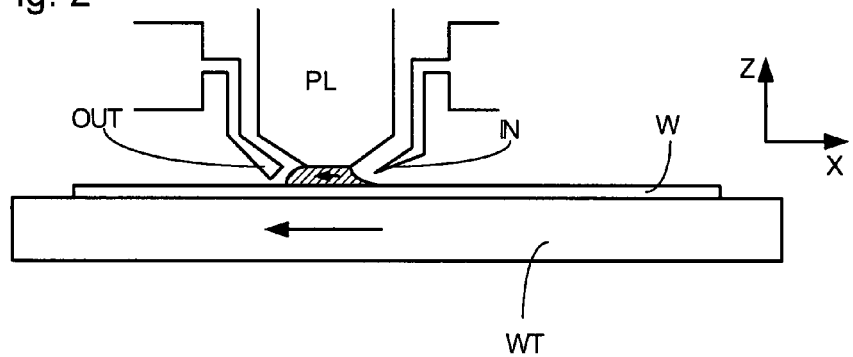
FIGS. 2 and 3 depict a liquid supply system for use in a lithographic projection apparatus.
Figure 3:
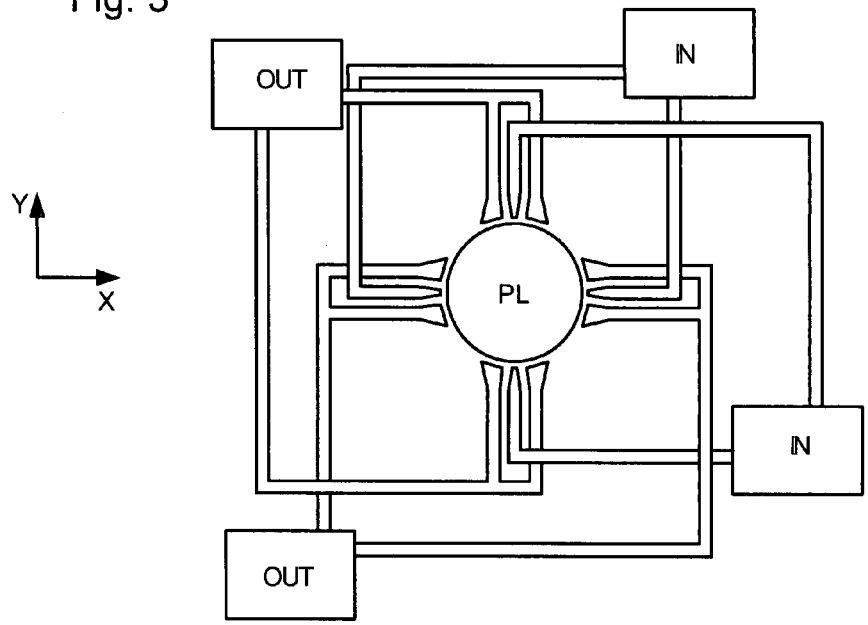
Figure 4:
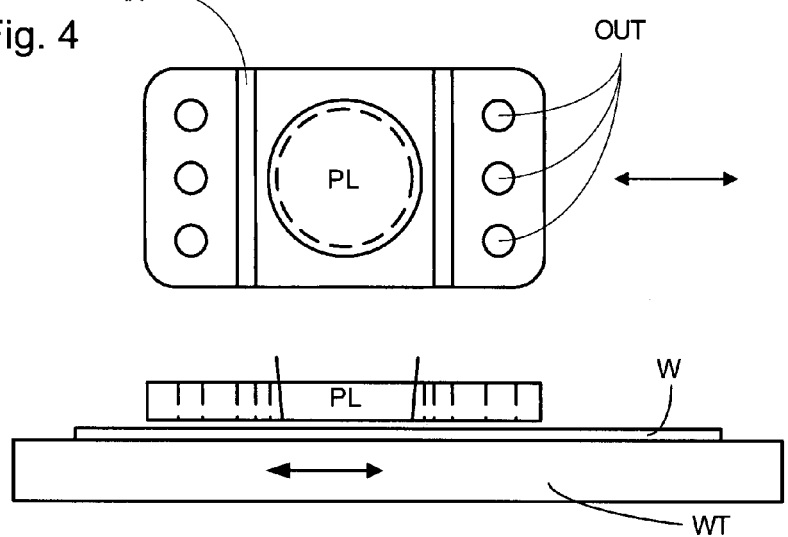
FIG. 4 depicts a another liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
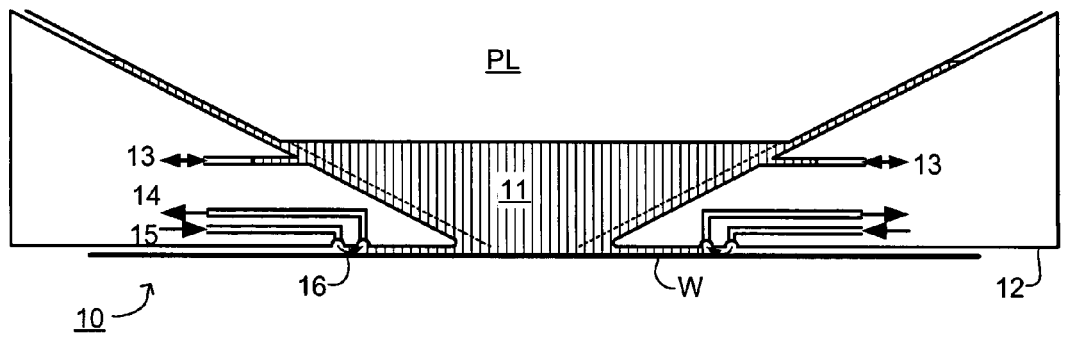
FIG. 5 depicts an immersion head according to an embodiment of the invention.

Another solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. Preferably the seal is a contactless seal such as a gas seal. Such as system with a gas seal is disclosed in United States patent application publication no. US 2004-0207824, hereby incorporated in its entirety by reference.

FIG. 5 shows the immersion head IH of FIG. 1 in more detail. It incorporates a contactless seal to keep liquid 11 within the immersion head reservoir 10. The reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but preferably $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity air flow inwards that confines the liquid.

Figure 6A:
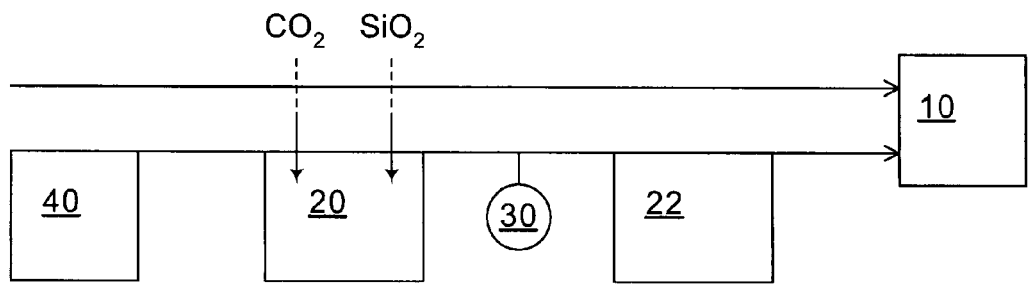
Figure 6B:
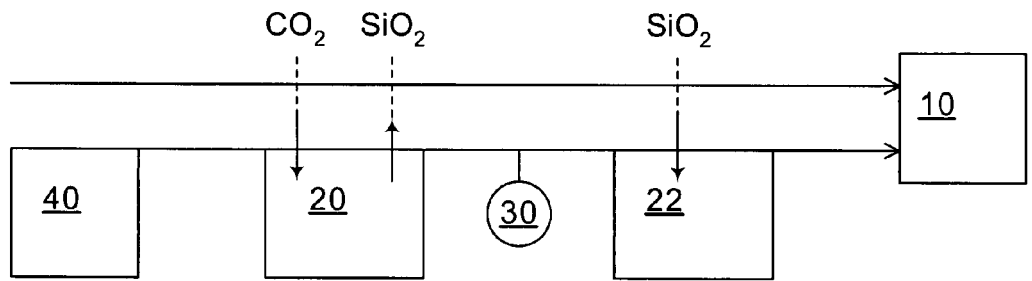

FIGS. 6a, 6b and 6c show the various steps involved in detecting and removing silicon dioxide from the liquid as it travels to the immersion head reservoir 10. A TOC remover/UV lamp 40 is located upstream of the immersion head 10. Downstream of the UV lamp 40 is a first polisher 20, then a conductivity sensor 30 and finally a second polisher 22. As the TOC remover/UV lamp 40 is deployed, a by-product of TOC removal is carbon dioxide. The polishers 20 and 22 comprise an ion-exchange resin that absorbs carbon dioxide as well as silicon dioxide. As shown in FIG. 6a, at the beginning of the process, polisher 20 absorbs both carbon dioxide and silicon dioxide.

Polisher 20 will absorb carbon dioxide and silicon dioxide until it is saturated. At this point, because the resin of the polisher 20 has a greater affinity for carbon dioxide than for silicon dioxide, the polisher will continue to absorb carbon dioxide and begin to desorb silicon dioxide. Silicon dioxide therefore is returned into the liquid and is subsequently absorbed by polisher 22. This absorption of carbon dioxide and desorption of silicon dioxide goes on until polisher 20 is saturated with carbon dioxide. This is shown in FIG. 6c. Polisher 20 is fully saturated and no longer absorbs either carbon dioxide or silicon dioxide. Carbon dioxide and silicon dioxide therefore continue down the conduit to polisher 22 which is still absorbing both carbon dioxide and silicon dioxide. Because these compounds are being absorbed by the second polisher 22, the liquid reaching the immersion head 10 is still free from undesirable particles. Because there is now carbon dioxide in the liquid downstream of the first polisher, the conductivity sensor 30 senses the carbon dioxide in the liquid and sends a signal indicating that one or more of the polishers are saturated and a request for the one or more of the polishers to be replaced or cleaned.

The size of the second polisher 22 can be balanced with the size of the first polisher 20 such that there is time to change one or more polishers once sensor 30 has detected carbon dioxide before polisher 22 becomes saturated as well.

In other words, there is indirect measurement of silicon dioxide by measuring carbon dioxide levels. Carbon dioxide is far simpler to detect than silicon dioxide and can be done on-line. This method therefore provides robust on-line monitoring of silicon dioxide in liquid supply system liquid using industry standard equipment.

In European Patent Application No. 03257072.3 the idea of a twin or dual stage immersion lithography apparatus is disclosed. Such an apparatus is provided with two tables for supporting one or more substrates. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A method of processing a liquid, comprising sensing presence of carbon dioxide in the liquid in an immersion lithographic apparatus to indirectly detect silicon dioxide in the liquid, the carbon dioxide presence indicative of the presence of silicon dioxide in the liquid.

2. The method of claim 1, further comprising removing silicon dioxide from the liquid using a polisher that absorbs silicon dioxide and carbon dioxide from the liquid.

3. The method of claim 2, comprising sensing the carbon dioxide downstream from the polisher.

4. The method of claim 2, comprising, subsequent to sensing the carbon dioxide, initiating a request that the polisher be replaced or cleaned.

5. The method of claim 2, comprising removing silicon dioxide from the liquid using a further polisher that absorbs silicon dioxide from the liquid, the further polisher located downstream from the polisher that absorbs silicon dioxide and carbon dioxide from the liquid.

6. The method of claim 2, further comprising, upstream of the polisher, (i) exposing the liquid to UV radiation, or (ii) removing total organic content, or (iii) both (i) and (ii).

7. The method of claim 1, comprising sensing the carbon dioxide between an upstream polisher and a downstream polisher, each polisher configured to absorb silicon dioxide and carbon dioxide from the liquid.

8. The method of claim 7, wherein the upstream polisher has a greater affinity for carbon dioxide than silicon dioxide such that once the upstream polisher is saturated with carbon dioxide and silicon dioxide, the upstream polisher desorbs silicon dioxide in order to absorb more carbon dioxide and once the upstream polisher is saturated with carbon dioxide, the upstream polisher stops absorbing either silicon dioxide or carbon dioxide.

9. An immersion lithographic apparatus configured to indirectly monitor a level of silicon dioxide in a liquid, the apparatus comprising a sensor system configured to sense carbon dioxide in the liquid and to determine and indicate the presence of silicon dioxide based on the presence of carbon dioxide.

10. The apparatus of claim 9, wherein the sensor system comprises a conductivity sensor.

11. The apparatus of claim 9, comprising a polisher configured to absorb silicon dioxide and carbon dioxide from the liquid.

12. The apparatus of claim 11, wherein the sensor system is configured to sense the carbon dioxide downstream from the polisher.

13. The apparatus of claim 11, wherein the sensor system is configured to, subsequent to sensing of carbon dioxide, initiate a request that the polisher be replaced or cleaned.

14. The apparatus of claim 11, comprising a further polisher configured to absorb silicon dioxide from the liquid, the further polisher located downstream from the polisher configured to absorb silicon dioxide and carbon dioxide from the liquid.

15. The apparatus of claim 11, further comprising, upstream of the polisher, a (i) UV lamp, (ii) a total organic content remover, or (iii) both (i) and (ii).

16. The apparatus of claim 9, comprising an upstream polisher and a downstream polisher, each polisher configured to absorb silicon dioxide and carbon dioxide from the liquid, and wherein the sensor system is configured to sense the carbon dioxide between the upstream and downstream polishers.

17. The apparatus of claim 16, wherein the upstream polisher has a greater affinity for carbon dioxide than silicon dioxide such that once the upstream polisher is saturated with carbon dioxide and silicon dioxide, the upstream polisher desorbs silicon dioxide in order to absorb more carbon dioxide and once the upstream polisher is saturated with carbon dioxide, the upstream polisher stops absorbing either silicon dioxide or carbon dioxide.

18. An apparatus configured to remove silicon dioxide from a liquid in an immersion lithographic apparatus, the apparatus comprising:
a polisher configured to absorb carbon dioxide and silicon dioxide from liquid and having a greater affinity for carbon dioxide than for silicon dioxide; and
a sensor configured to sense presence of carbon dioxide in the liquid after exiting the polisher.

19. The apparatus of claim 18, comprising a further polisher configured to absorb silicon dioxide from the liquid.

20. The apparatus of claim 19, wherein the polisher and the further polisher are arranged in series along a conduit so that the polisher is upstream of the sensor which is upstream of the further polisher.

21. The apparatus of claim 18, wherein the polisher comprises an ion-exchanging resin with a greater affinity for carbon dioxide than silicon dioxide.

22. The apparatus of claim 18, wherein the sensor comprises a conductivity sensor.

23. The apparatus of claim 18, further comprising, upstream of the polisher, a (i) UV lamp, (ii) a total organic content remover, or (iii) both (i) and (ii).

24. A lithographic apparatus, comprising:
a substrate table configured to hold a substrate;
a projection system configured to project a patterned beam of radiation toward the substrate;
a liquid supply system configured to supply liquid to a space traversed, in use, by the patterned beam of radiation;
a polisher configured to absorb carbon dioxide and silicon dioxide from the liquid and having a greater affinity for carbon dioxide than for silicon dioxide; and
a sensor configured to sense presence of carbon dioxide in the liquid after exiting the polisher.

25. The apparatus of claim 24, comprising a further polisher configured to absorb silicon dioxide from the liquid downstream from the polisher.

* * * * *